(12) United States Patent
Guirman et al.

(10) Patent No.: US 6,837,952 B1
(45) Date of Patent: Jan. 4, 2005

(54) METHOD FOR MAKING A BOWL IN THERMOSTRUCTURAL COMPOSITE MATERIAL

(75) Inventors: Jean-Michel Guirman, Begles (FR); Dominique Coupe, Le Haillan (FR); Jean-Michel Georges, Blanquefort (FR)

(73) Assignee: SNECMA Moteurs, Paris (FR)

( * ) Notice: Subject to any disclaimer, the term of this patent is extended or adjusted under 35 U.S.C. 154(b) by 75 days.

(21) Appl. No.: 09/889,862

(22) PCT Filed: Nov. 24, 2000

(86) PCT No.: PCT/FR00/03276
§ 371 (c)(1),
(2), (4) Date: Jul. 23, 2001

(87) PCT Pub. No.: WO01/38625
PCT Pub. Date: May 31, 2001

(30) Foreign Application Priority Data

Nov. 24, 1999 (FR) .............................................. 99 14766
Aug. 11, 2000 (FR) .............................................. 00 10564

(51) Int. Cl.$^7$ .......................... B32B 31/00; B65H 81/00
(52) U.S. Cl. ....................... 156/148; 156/155; 156/256; 156/169
(58) Field of Search ................................. 156/250, 256, 156/169, 155, 148

(56) References Cited

U.S. PATENT DOCUMENTS

| 4,193,252 A | * | 3/1980 | Shepherd et al. ............. 57/351 |
| 4,748,079 A | * | 5/1988 | Thebault .................. 428/293.4 |
| 5,226,217 A | * | 7/1993 | Olry et al. ..................... 28/107 |
| 5,482,257 A | * | 1/1996 | Holcombe et al. .......... 266/275 |
| 5,543,005 A | * | 8/1996 | Monget et al. ............... 156/93 |
| 5,616,175 A | * | 4/1997 | Walsh .......................... 117/14 |
| 5,858,486 A | * | 1/1999 | Metter et al. .............. 428/34.1 |
| 5,914,002 A | * | 6/1999 | Cahuzac ...................... 156/93 |
| 6,319,348 B1 | * | 11/2001 | Olry et al. .................. 156/181 |
| 6,489,027 B1 | * | 12/2002 | Kondo et al. ............... 428/408 |

FOREIGN PATENT DOCUMENTS

| EP | 0 913 504 A1 | 5/1999 |
| EP | 0 971 054 A1 | 1/2000 |
| FR | 2 595 621 | 9/1987 |
| FR | 2 669 941 | 6/1992 |
| JP | 11-60373 | 3/1999 |
| SU | 1699755 A1 * | 12/1991 |
| WO | 97/20092 | 6/1997 |
| WO | 98/44182 | 10/1998 |
| WO | 98/55238 | 12/1998 |

* cited by examiner

Primary Examiner—Jeff H. Aftergut
(74) Attorney, Agent, or Firm—Weingarten, Schurgin, Gagnebin & Lebovici LLP

(57) ABSTRACT

A method manufacturing a one-piece bowl of thermostructural composite material comprising fiber reinforcement densified by a matrix. The method comprises supplying deformable fiber plies that are whole, being free from slots or cutouts, superposing said plies on a former of shape corresponding to the bowl to be made, deforming the plies, and bonding the superposed plies to one another by means of fibers extending transversely relative to the plies, e.g. by needling so as to obtain a bowl preform which is then densified. The bowl (1) can be used as a support for a crucible (5) in an installation for producing monocrystalline silicon.

50 Claims, 6 Drawing Sheets

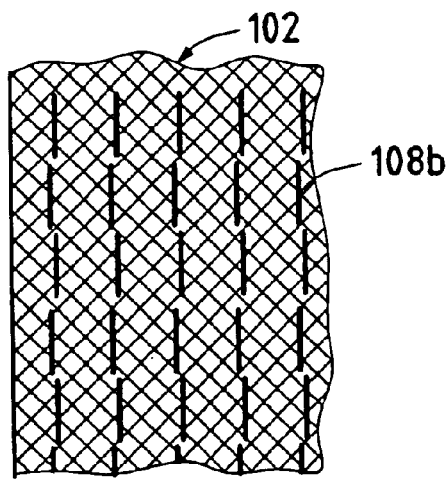
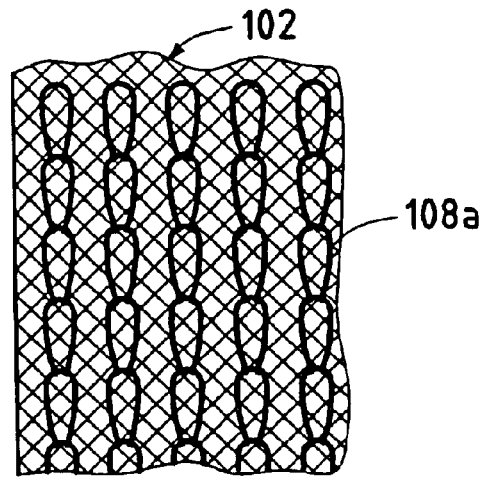
FIG.3A
FIG.3B
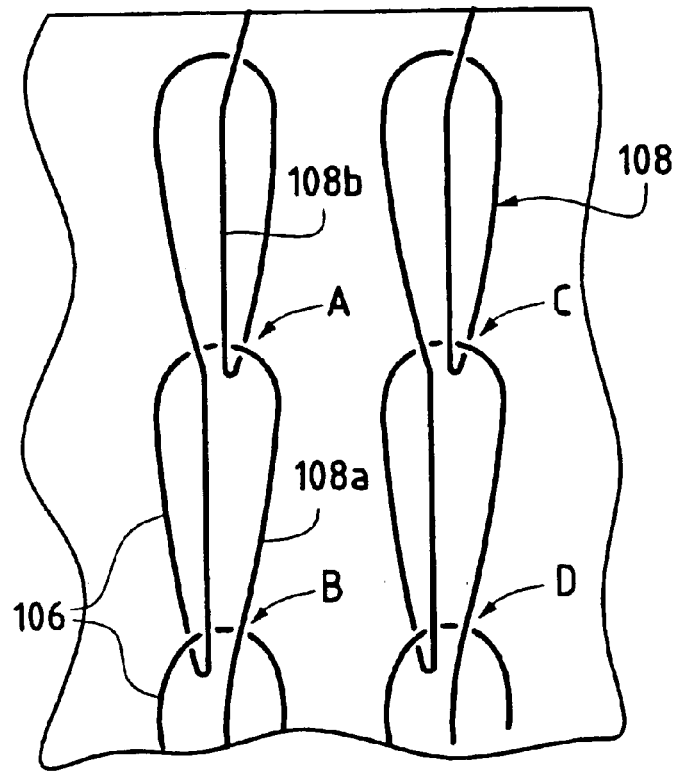
FIG.3C

US 6,837,952 B1

METHOD FOR MAKING A BOWL IN THERMOSTRUCTURAL COMPOSITE MATERIAL

FIELD OF THE INVENTION

The invention relates to manufacturing hollow parts out of thermostructural composite material, more particularly parts having a deep stamped shape that cannot be developed, that is not necessarily axially symmetrical, with an end wall portion and a side wall portion interconnected by portions in which the radius of curvature can be relatively small. For convenience, such parts are referred to throughout the remainder of the description and in the claims under the generic term of "bowls". A field of application of the invention is, for example, manufacturing bowls for receiving crucibles containing molten metal, such as silicon, in particular for drawing ingots of silicon, or of other metals in other metallurgical fields.

The term "thermostructural composite material" is used to mean a material comprising fiber reinforcement made of refractory fibers, e.g. carbon fibers or ceramic fibers, and densified by a refractory matrix, e.g. of carbon or of ceramics. Carbon/carbon (C/C) composite materials and ceramic matrix composite (CMC) materials are examples of thermostructural composite materials.

BACKGROUND OF THE INVENTION

A well-known method of producing silicon single crystals in particular for manufacturing semiconductor products consists in melting silicon in a receptacle, in putting a crystal germ having a desired crystal arrangement into contact with the bath of liquid silicon, so as to initiate solidification of the silicon contained in the crucible with the desired crystal arrangement, and in mechanically withdrawing an ingot of single crystal silicon obtained in this way from the crucible. This method is known as the Czochralski method or as the "CZ" method.

The receptacle containing the molten silicon is frequently a crucible made of silica or quartz ($SiO_2$) placed in a bowl, sometimes called a susceptor, which is generally made of graphite. Heating can be provided by radiation from an electrically conductive cylindrical body made of graphite, e.g. heated by the Joule effect, which surrounds the bowl. The bottom of the bowl stands on a support. For this purpose, the bottom of the bowl is generally machined, in particular so as to form a bearing surface for centering purposes and also a support zone. In addition, in the application in question, very high purity requirements make it necessary to use raw materials that are pure, with methods that do not pollute them, and/or with methods of purification in the finished state or in an intermediate state of bowl manufacture. For carbon-containing materials (such as graphite or C/C composites), methods of purification by high temperature treatment (at more than 2000° C.) under an atmosphere that is inert or reactive (e.g. a halogen) are known and are commonly used.

The pieces of graphite used as bowls are fragile. They are often made up of as a plurality of portions (so-called "petal" architecture) and they cannot retain molten silicon in the event of the crucible made of silica leaking or rupturing. This safety problem becomes more critical with the increasing size of the silicon ingots that are drawn, and thus with the increasing mass of the liquid silicon. Furthermore, graphite bowls are generally of short lifetime while being very thick and thus bulky and heavy.

To avoid these drawbacks, proposals have already been made to make bowls out of C/C composite material. Such a material has much better mechanical strength than graphite. Making bowls of large diameter, e.g. as great as or even more than 850 millimeters (mm) can then be envisaged in order to deal with the requirement for monocrystalline silicon ingots of larger section. In addition, the thickness of such bowls can be decreased compared with the thickness of graphite bowls, thus improving the transmission of heat flux to the crucible and reducing bulk. Furthermore, C/C composite materials are less exposed than graphite to becoming brittle following corrosion from SiO coming from the crucible.

The manufacture of a C/C composite material piece, or more generally a piece of thermostructural composite material, usually comprises making a fiber preform having the same shape as the piece that is to be made, and that constitutes the fiber reinforcement of the composite material, and then densifying the preform with the matrix.

Techniques presently in use for making preforms include winding yarns by coiling yarns on a mandrel having a shape that corresponds to the shape of the preform that is to be made, draping which consists in superposing layers or plies of two-dimensional fiber fabric on a former matching the shape of the preform to be made, the superposed plies optionally being bonded together by needling or by stitching, or indeed by three-dimensional weaving or knitting.

The preform can be densified in well-known manner using a liquid process, a gas process, or a dual process combining both of them. Liquid process densification consists in impregnating the preform—or in pre-impregnating the yarns or plies making it up—with a matrix precursor, e.g. a carbon or ceramic precursor resin, and in transforming the precursor by heat treatment. Gas densification, known as chemical vapor infiltration, consists in placing the preform in an enclosure and in admitting a matrix-precursor gas into the enclosure. Conditions, in particular temperature and pressure conditions, are adjusted so as to enable the gas to diffuse into the core of the pores of the preform, so that on coming into contact with the fibers it forms a deposit of matrix-constituting material thereon by one of the components of the gas decomposing or by a reaction taking place between a plurality of components of the gas.

For pieces that are of hollow shape that cannot be developed, for example pieces that are bowl shaped, a particular difficulty lies in making a fiber preform having the right shape.

The filament-winding technique is very difficult to implement in order to obtain a bowl shape as a single piece. A solution that can be recommended is to make the side wall of the bowl preform by winding a filament and to make the portion of the preform that corresponds to the bottom of the bowl separately.

The technique of draping plies is also difficult to implement for shapes that are this complex when it is desired to avoid forming extra thickness due to folds in the plies. A known solution consists in cutting the plies, in particular to form slots, as a function of the shape that is to be made so that the plies can fit closely on this shape with the lips of the cutouts or slots coming together once draped and shaped. Such plies must be precut with very great precision. Cut plies also present the drawback of leaving discontinuities in the yarns of the preform.

OBJECT AND SUMMARY OF THE INVENTION

In one of its aspects, an object of the invention is to propose a method of manufacturing a bowl out of thermostructural composite material making it possible to avoid the drawbacks of the prior art, while remaining simple and low in cost.

According to the invention, the method comprises the steps which consist in:

providing deformable two-dimensional fiber plies;

superposing the plies while deforming them on a former having a shape that corresponds to the shape of the bowl to be made, the plies fitting closely on said former by deforming and without forming folds; and bonding together the deformed plies by means of fibers that extend transversely relative to the plies, so as to obtain a bowl preform which is subsequently densified.

The invention is remarkable in that the bowl preform can be made of unitary plies that do not include any slots for enabling them to fit closely to the desired shape. This contributes to providing better mechanical and cohesive behavior to the bowl obtained by densifying the preform, and to providing a high level of safety in the event of the crucible breaking, in the context of the application to drawing silicon ingots.

The plies are made of deformable fiber fabric. Advantageously, a fabric is used made up of a plurality of unidirectional sheets superposed in different directions, for example two unidirectional sheets superposed with directions at an angle preferably lying in the range 45° to 60° relative to each other, the sheets being bonded together so as to form deformable individual mesh loops. The sheets can be bonded together by needling or by knitted thread or by stitching. Entire plies are cut out to the desired dimensions in the deformable fabric. Plies are thus obtained having a capacity for deformation which is sufficient to enable them to take up the desired shape merely by deforming, without forming folds or increases in thickness.

Advantageously, the deformed plies are bonded to one another by needling, so as to transfer fibers taken from the plies by the needles in a direction that extends transversely relative to the plies. Each new draped ply can be needled onto the underlying structure, advantageously while controlling the density of transferred fibers throughout the thickness of the preform.

In a variant, the deformed sheets can be bonded together by stitching or by implanting threads.

In another implementation of the method of the invention, the deformable fiber fabric constituting the plies is a knit.

The fibers constituting the plies are preferably made of carbon or of a carbon precursor. If they are made of precursor, heat treatment is performed after the preform has been made so as to transform the precursor into carbon.

After the preform has been made, it can be subjected to a step of consolidation by a liquid method, and to heat treatment for stabilizing the fibers and for purification which can be performed after or prior to consolidation.

The optionally consolidated preform is preferably densified by chemical gas infiltration.

In a preferred implementation, deformable two-dimensional fiber plies are used that are whole, having no cutouts or slots, so as to obtain a complete bowl preform as a single piece, and densification is performed on the complete bowl preform. A one-piece bowl of thermostructural composite material can thus be obtained directly.

In another implementation, one-piece deformable two-dimensional fiber plies are likewise used that are free from any cutouts or slots so as to obtain a complete bowl preform, but a hole is made through the bottom of the preform prior to densification by chemical vapor infiltration. The presence of this hole enhances flow of the gas, thereby making it possible to increase densification efficiency, particularly with bowls of large dimensions. After the preform has been densified, at least in part, the hole is closed with a plug. It is possible to use a plug made of thermostructural composite material. After the hole has been closed by the plug, a final step of densification by chemical vapor infiltration can be performed.

In yet another implementation, one-piece two-dimensional fiber plies are used that present a substantially central opening, and the plies are superposed on the former with their openings in alignment so as to obtain a bowl preform presenting a hole passing through the bottom of the preform and constituted by the aligned openings in the plies. After the preform has been densified at least in part by chemical vapor infiltration, the hole is closed by a plug. As mentioned above, the bowl can be made of a thermostructural composite material and a final step of chemical vapor infiltration can be performed.

In any event, once the preform has been densified, a bowl blank is obtained.

Final purification heat treatment can then optionally be performed.

In addition, a final deposition of pyrolytic carbon and/or of silicon carbide (SiC) can be performed, at least on the inside face of the bowl.

In another aspect, the invention also provides a bowl of thermostructural composite material of the kind that can be obtained by the above-defined method.

In the invention, such a bowl is characterized in that it comprises fiber reinforcement comprising two-dimensional fiber plies which are superposed and bonded together by fibers extending transversely relative to the plies.

Advantageously, the fiber reinforcement constitutes a single piece made up of one-piece two-dimensional plies free from slots and cutouts.

A coating of pyrolytic carbon can be present on the surface of the bowl, at least on the inside of the bowl.

The invention also provides the use of such a bowl as a crucible support, in particular for producing monocrystalline silicon. A protective layer, e.g. of thermostructural composite material, such as a C—C composite, can be interposed between the bowl and the crucible.

BRIEF DESCRIPTION OF THE DRAWINGS

The invention will be better understood on reading the following description given by way of non-limiting indication and made with reference to the accompanying drawings, in which:

FIGS. 3A, 3B, and 3C are views showing a two-dimensional ply with deformable mesh loops suitable for implementing the method of FIG. 2;

DETAILED DESCRIPTION OF IMPLEMENTATIONS OF THE INVENTION

As already mentioned, a non-limiting example to which the invention applies is that of making bowls of thermostructural composite material for supporting crucibles in installations that produce single crystal silicon ingots.

Figure 1:
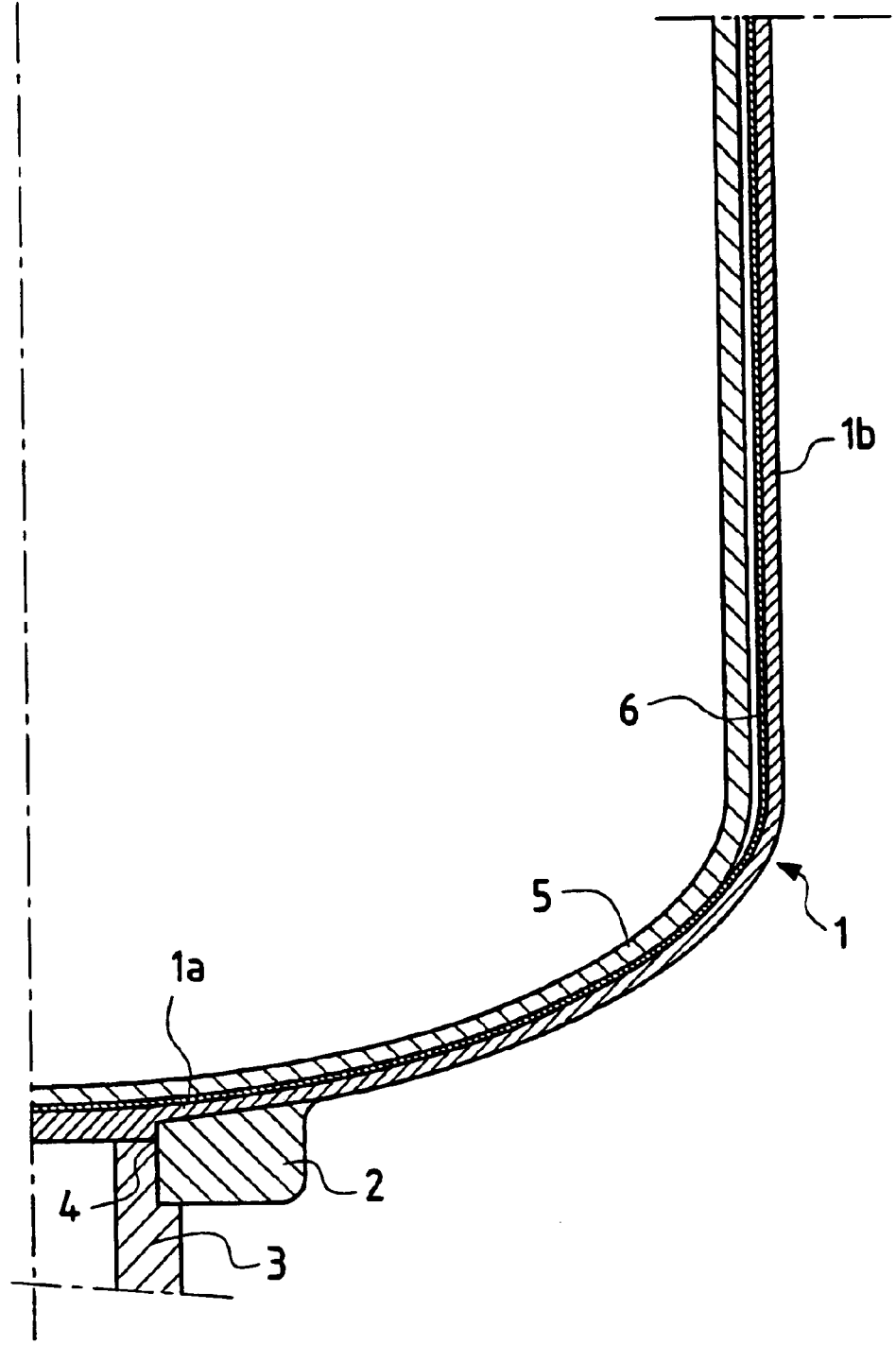
FIG. 1 is a highly diagrammatic half-section view showing a bowl of composite material used as a crucible support in an installation for producing silicon ingots.

Highly diagrammatic FIG. 1 shows such a bowl of composite material, e.g. C/C composite material supporting a crucible 5 which is usually made of silica. The bowl 1 stands on an annular support formed with a ring 2 mounted at the end of a shaft 3 having a setback 4 therein. The bowl has a bottom portion 1a and a surround portion 1b, part of which is substantially cylindrical and is connected to the bottom portion via a region of rounded profile. The bottom portion of the bowl 1 is machined so as to form a centering bearing surface corresponding to the setback 4 and a support surface on the ring 2.

After the crucible has been filled with silicon, the assembly is placed in a furnace and the temperature in the furnace is raised to a value which is high enough to cause the silicon to liquefy. At this temperature, greater than 1420° C., the silica crucible softens and it matches the shape of the bowl. A germ having a crystal arrangement is then brought into contact with the bath of silicon and an ingot is extracted slowly therefrom, thereby forming a column between the germ and the bath. An ingot can thus be drawn, and its length can lie in the range 1 meter (m) to 2 m.

That method of manufacturing silicon ingots is well known and does not form part of the invention, such that a more detailed description is not required.

Because thermostructural composite materials have the ability to conserve good mechanical properties and good dimensional stability at high temperatures, they are particularly suitable for making bowls for use in the above application.

The description below relates more particularly to making bowls out of C/C composite materials with carbon fiber reinforcement and a carbon matrix, or at least a matrix that is essentially made of carbon. The invention also covers making bowls out of CMC type composite materials, i.e. having ceramic fiber reinforcement (e.g. made of SiC fibers) and a matrix that is also ceramic (e.g. likewise of SiC), where technologies for making CMCs are well known.

The fiber reinforcement can be made from carbon yarns of the kind commercially available, but preferably free from any of the surface treatment normally performed to provide surface functions that encourage bonding with an organic matrix when such yarns are used to form fiber/resin type composite materials that are not intended for high temperature applications. The absence of surface functions makes it possible to avoid internal stresses during the process of manufacturing the composite material using the method of the invention.

In a variant, before or immediately after making the fiber reinforcement, it is possible to subject ordinary commercial carbon yarns to heat treatment seeking to eliminate surface functions, and the fibers constituting the yarns can be provided with a thin interphase coating of pyrolytic carbon, typically having a thickness less than or equal to 0.1 micrometers ($\mu$m). The interphase coating of pyrolytic carbon can be obtained by chemical vapor deposition, as described in the Applicants' U.S. Pat. No. 4,748,079.

A first implementation of the method for manufacturing a composite material bowl is described below with reference to FIG. 2.

A first step 10 of the method consists in providing deformable two-dimensional plies of carbon fiber.

The plies are made of a deformable fiber fabric, advantageously made up of unidirectional sheets of carbon yarns having no surface functions, which are superposed with different directions and bonded together so as to form deformable individual mesh loops.

The sheets can be bonded together by light needling which provides the fabric with cohesion while leaving it with sufficient ability to deform. It is also possible to bond the sheets to one another by stitching using a thread passing from one face to the other of the fabric.

The sheets are preferably bonded together by knitting a thread passing from one face to the other of the fabric, as shown in FIGS. 3A to 3C. Such deformable fabrics are known and they are described in the Applicants' document WO 98/44182. They are constituted by two unidirectional sheets superposed with the directions between each other making an angle of less than 90°, preferably an angle lying in the range 45° to 60°.

FIGS. 3A and 3B show the front and back faces of the fabric 102 while FIG. 3C shows in greater detail the knitting stitch 108 used. The stitch is in the form of interlaced loops 108a that are elongate in a longitudinal direction of the fabric 102 and that form a plurality of parallel rows, together with V-shaped or zigzag paths 108b which interconnect loops in adjacent rows. The fabric 102 is situated between the paths 108b situated on the front face (FIG. 3A) and the loops 108a situated on the back face (FIG. 3B), giving the knit the appearance of a zigzag stitch on one face and the appearance of a chain stitch on the other face. The knitting stitch overlies a plurality of yarns in each unidirectional sheet depending on the gauge selected for the knitting machine.

The bridges between the zigzag paths 108b and the loops 108a, such as points A, B, C, and D in FIG. 3C define the vertices of the deformable individual mesh loops. Under such circumstances, both the loops defined by the knitting stitch and the loops defined by the cross-points between the threads of the sheets are deformable, with the cross-points serving to constitute deformable parallelograms.

The knitting thread used 106 can be a carbon thread or a thread made of a carbon precursor, or indeed a thread made of a sacrificial material, i.e. a material that is to be removed by being dissolved or by heat so as to leave no residue at a subsequent stage in the manufacture of the composite bowl. An example of a sacrificial thread is a thread made of polyvinyl alcohol (PVA) that is soluble in water.

The plies are cut out from the deformable fabric to the outside dimensions that are required by the shape and dimensions of the bowl to be made. The plies are whole, constituting single pieces that are free from any internal cutouts or slots.

In the following step 20 of the method, the plies are draped onto tooling having a shape corresponding to the shape of the bowl that is to be made. Draping can be performed manually.

Because the mesh loops of the plies are deformable and because of the way in which the plies are draped, it is possible to give the superposed plies the desired shape without forming any folds, while nevertheless using plies that are whole without any slots or cutouts.

Compared with the technique consisting in forming cutouts in two-dimensional plies that are not sufficiently deformable, e.g. so as to form petals that can fit closely to the desired shape without folds or extra thicknesses, the use of plies having deformable mesh loops presents the advantages of being easier to drape and of preserving the integrity of the structure of the plies. This point is particularly important for the mechanical properties of the final bowl.

The plies are superposed by being offset angularly about the axis of the preform passing through the top thereof, so as to avoid exact superposition of their patterns, since that can lead to non-uniformity in the structure.

The plies are stacked until the desired thickness has been obtained for the bowl preform, and they are bonded to one another by needling (step 30).

The needling can be performed after the plies have been draped, or preferably as the draping is taking place, e.g. by needling each newly-draped ply.

By way of example, a needling installation is used of the kind described in the Applicants' U.S. Pat. No. 5,266,217. As shown very diagrammatically in FIG. 4, such an installation comprises a table 300 supporting a former 302, a robot 304 having a control unit 306 connected to an operator console 308 and a needling head 310 fixed to the end to the arm 312 of the robot 304. The other end of the arm 312 is hinged about a vertical axis to a vertically movable support 314. In the vicinity of the needling head, the arm 312 has a multi-axis articulation 316.

The needling head 310 thus possesses the degrees of freedom required for being brought into the desired position with the desired orientation for needling the plies draped on the former 302, and to perform needling along preestablished trajectories with a predetermined direction of incidence, generally normal to the plies.

The former 302 is provided with a backing coating, e.g. a felt into which the needles of the head 310 can penetrate without being damaged.

The needling head 310 is provided with a presser plate 310a having perforations through which the needles pass. The presser plate is urged resiliently to exert controlled pressure on the plies being needled.

Advantageously, needling is performed while controlling the density of fibers transferred by the needles transversely relative to the plies. This can be achieved by controlling the penetration depth of the needles so as to obtain needling density that is substantially constant throughout the thickness of the preform.

The preform 320 constituted by the draped and needled plies 102 is advantageously associated with additional plies being draped (step 40) having dimensions that are restricted to the dimensions of the bottom portion of the bowl that is to be made.

Figure 5:
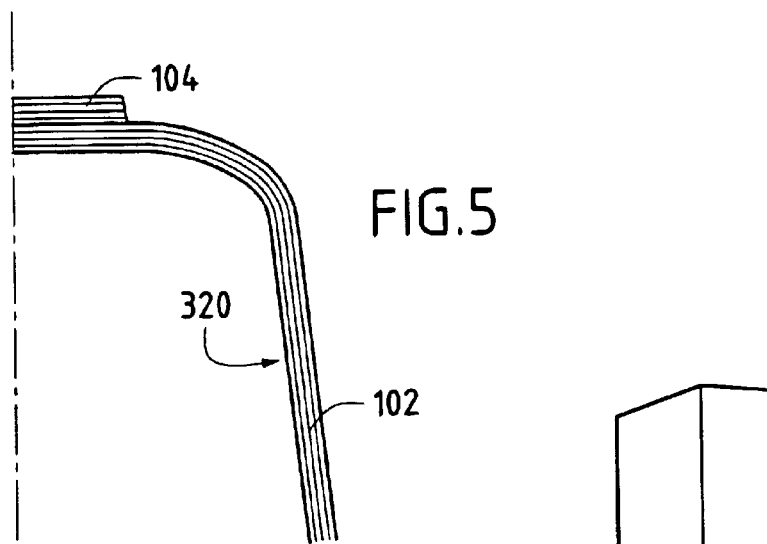
FIG. 5 is a fragmentary diagrammatic view showing additional draping of plies over a portion of the bottom of the bowl.

As shown in FIG. 5, the additional plies 104 (which can be of the same kind as the plies 102) are draped on the bottom of the preform 320 until sufficient thickness has been obtained to enable the bottom portion of the bowl to be machined so as to form a support face with a centering bearing surface.

The plies 104 are bonded together and to the plies 102 by needling. This is done using a needling installation of the kind described above.

The resulting fiber preform is then subjected to a consolidation process using a liquid.

For this purpose, the fiber preform 54 is placed in a mold 56 and impregnated with a liquid precursor of carbon (step 50). Impregnation can be performed using a phenolic resin, for example.

After the resin has been polymerized in the mold, the preform is removed from the mold and is subjected to heat treatment to carbonize the resin.

In a variant, impregnation can be performed on the preform while it is maintained on the former, after needling. For this purpose, the resin is inserted into the preform while it is covered in a flexible cover, e.g. made of elastomer, possibly associated with suction. The cover can then be withdrawn and the preform removed, after the resin has polymerized and before it is carbonized.

The following step 60 of the method consists in performing heat treatment to stabilize the carbon fibers dimensionally and to purify the consolidated preform. The heat treatment is performed at a temperature that preferably lies in the range 1600° C. to 2800° C. It serves to prevent subsequent dimensional variation of the fibers during continued manufacture of the bowl when the fibers have not previously been exposed to a temperature not less that that to which they are exposed subsequently, in particular during densification. This encourages removal of the impurities contained in the fibers and in the coke of the consolidation resin.

Thereafter, the preform is densified by a matrix of pyrolytic carbon using chemical vapor infiltration (step 70). To this end, in well-known manner, the preform can be placed in an enclosure into which a gas is introduced that contains a precursor of carbon, e.g. methane. The pressure and temperature conditions are selected in such a manner as to enable the gas to diffuse within the pores of the consolidated preform, and to enable the methane to decompose so as to give a deposit of pyrolytic carbon.

Chemical vapor infiltration can be implemented under constant-temperature, constant-pressure conditions, or with a temperature gradient, both of which processes are well known.

Infiltration can also be performed by immersing the consolidated preform in a liquid precursor and by heating the preform so as to develop a film of gaseous precursor at its surface. Such a method is described, for example in the Applicants' document FR 2 784 695.

In another variant, the preform can be densified using a liquid in the form of a precursor for the matrix, e.g. a resin.

After densification, the resulting bowl blank is machined (step 80) in particular for the purpose of forming the centering bearing surface and the support surface at the bottom of the bowl.

A final heat treatment step is performed (step 90) e.g. at a temperature in the range 2200° C. to 2700° C. in order to purify the resulting C/C composite bowl. In conventional manner, the purification treatment can be performed in the presence of a halogen.

A final deposit of pyrolytic carbon (step 100) can be performed by chemical vapor deposition. This deposit is formed on the surface of the bowl, at least on the inside. In variant, this final deposit can be of silicon carbide (SiC), likewise obtained by chemical vapor deposition.

The final deposition of pyrolytic carbon or of SiC could alternatively be performed prior to the final purification heat treatment.

Another implementation of the method of the invention is described below with reference to FIGS. 6 and 7.

Figure 2:
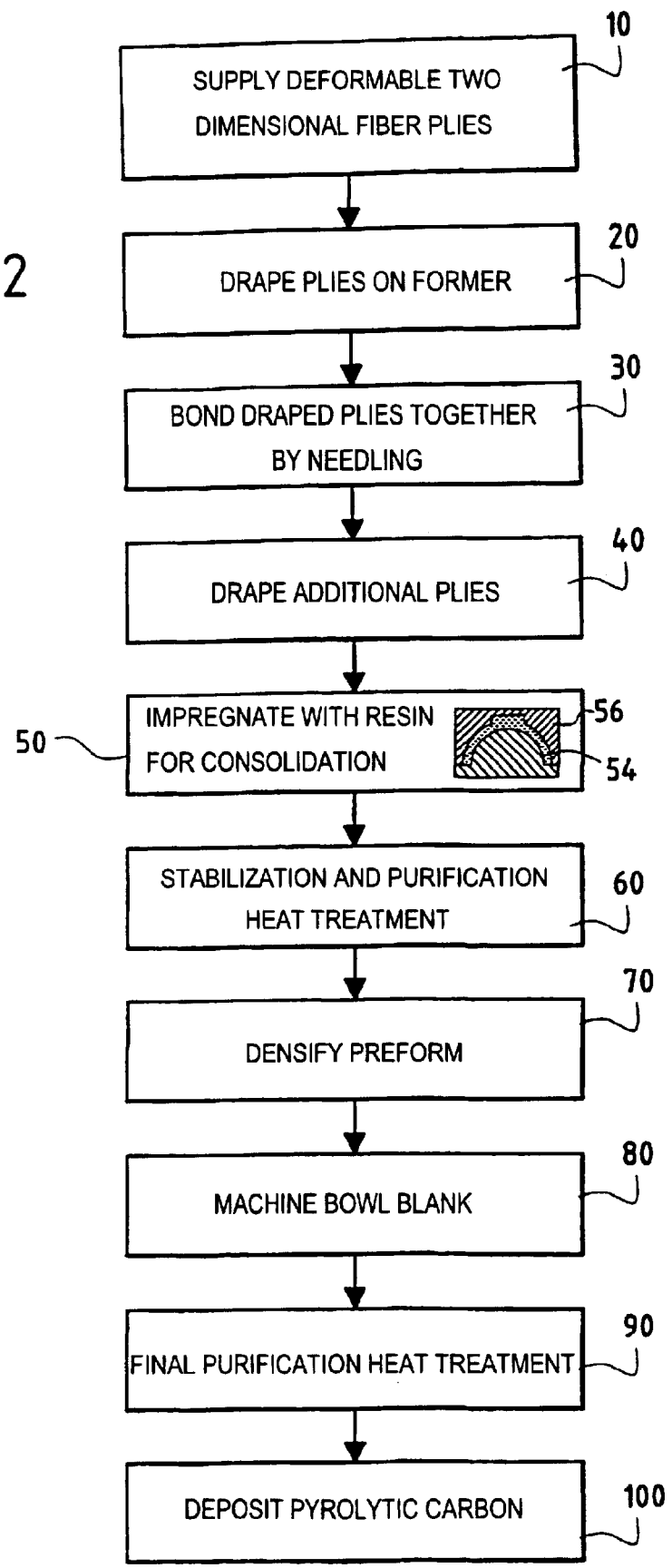
FIG. 2 is a flow chart showing the successive steps in a first implementation of a method in accordance with the invention.
Figure 6:
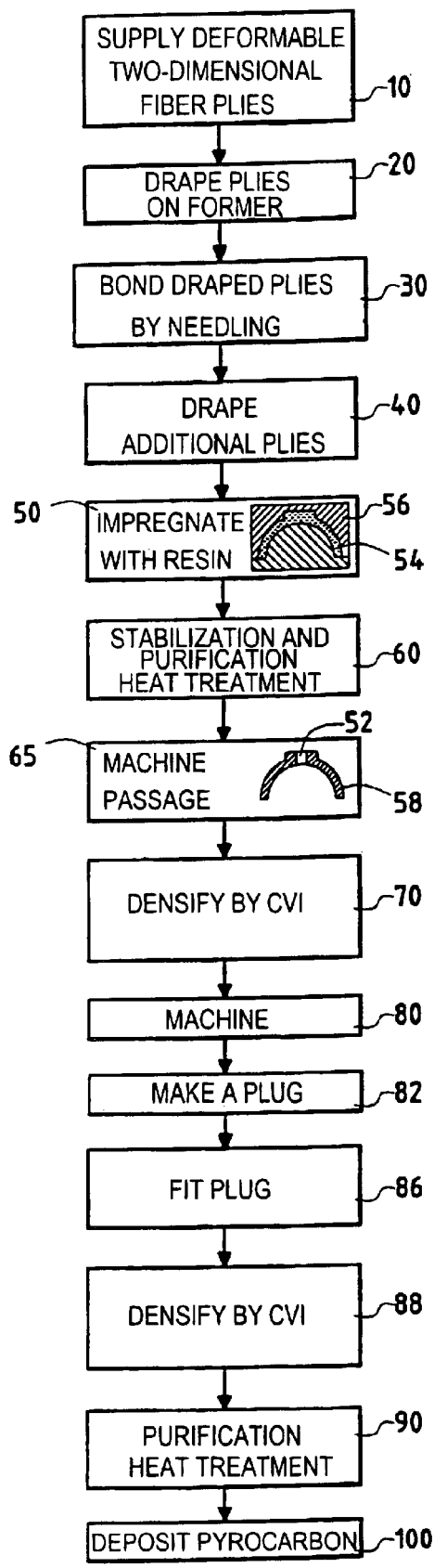
FIG. 6 is a flow chart showing successive steps in a second implementation of a method in accordance with the invention.
Figure 7:
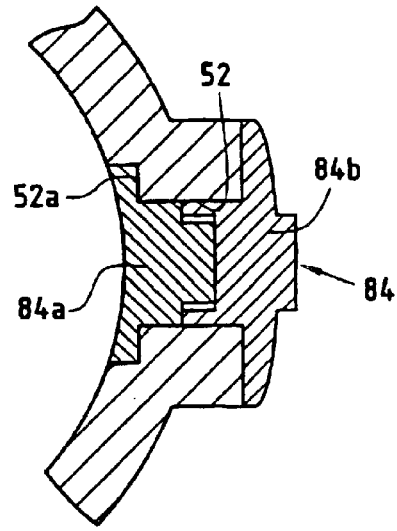
FIG. 7 is a diagrammatic section view showing a plug closing a hole formed in the bottom of a preform.

The method whose successive steps are shown in FIG. 6 has the same initial steps 10 to 60 as the method of FIG. 2, i.e. supplying deformable two-dimensional fiber plies (step 10), draping the plies on a former (step 20), bonding the draped plies together by needling (step 30), draping additional plies (step 40), impregnating with a resin for consolidation purposes (step 50), and stabilization and purification heat treatment (step 60).

Thereafter, the method of FIG. 6 differs from that of FIG. 2 in that prior to densifying the preform, a hole 52 is machined through the bottom of the consolidated preform 58 (step 65). It should be observed that the hole 52 can be formed in the non-consolidated preform prior to impregnation with the resin, or immediately after the resin has been polymerized but prior to the resin being carbonized.

The presence of the hole 52 can be beneficial during densification of the preform by chemical vapor infiltration. The hole 52 encourages flow of the gas through the enclosure in which the preform is placed.

Step 70 of densifying the preform is thus preferably performed by chemical vapor infiltration.

The preform densified in this way is machined (step 80) in particular the bottom of the preform is machined.

A plug is then made (step 82) for inserting in the hole 52 (step 86).

The plug can be made of various different materials, e.g. of graphite, or preferably of a thermostructural composite material such as a C/C composite. The plug can be made as one or more parts that are obtained by densifying one or more corresponding preforms. The or each preform is formed by superposing two-dimensional plies, e.g. of woven fabric, which are bonded together by needling or by stitching. Densification by means of a carbon matrix is then performed using a liquid or by chemical vapor infiltration. In the example shown in FIG. 7, the plug 84 comprises two parts 84a and 84b. The part 84a is cup-shaped with a lip-shaped outline that bears against a setback 52a formed in the wall of the hole 52 on the inside of the bowl preform. The outside face of the part 84a is of a shape that fits continuously with the inside face of the bowl. The part 84b is also cup-shaped with an outline in the form of a lip which bears against the outside face of the bottom of the preform of the bowl around the hole 52. The parts 84a and 84b can be bonded together by screw fastening, with the part 84a having a projecting central portion which is screwed into a housing in the part 84b. The parts 84a and 84b are thus clamped to the rim of the hole 52.

After the plug has been put into place, a new step 88 of chemical vapor infiltration can be performed so as to complete assembly of the plug 84 with the bottom portion of the bowl preform and so as to finish off densification. The densification performed in step 80 could then have been performed in partial manner.

Steps 90 and 100 of final heat treatment for purification and for depositing pyrolytic carbon can then be performed as in the method of FIG. 2. Yet another implementation of the method of the invention is briefly described with reference to FIG. 8.

This method comprises steps 10 to 100 that are the same as the method of FIG. 2 with the exception of steps 30 and 40 of bonding draped plies and of draping additional plies.

Figure 8:
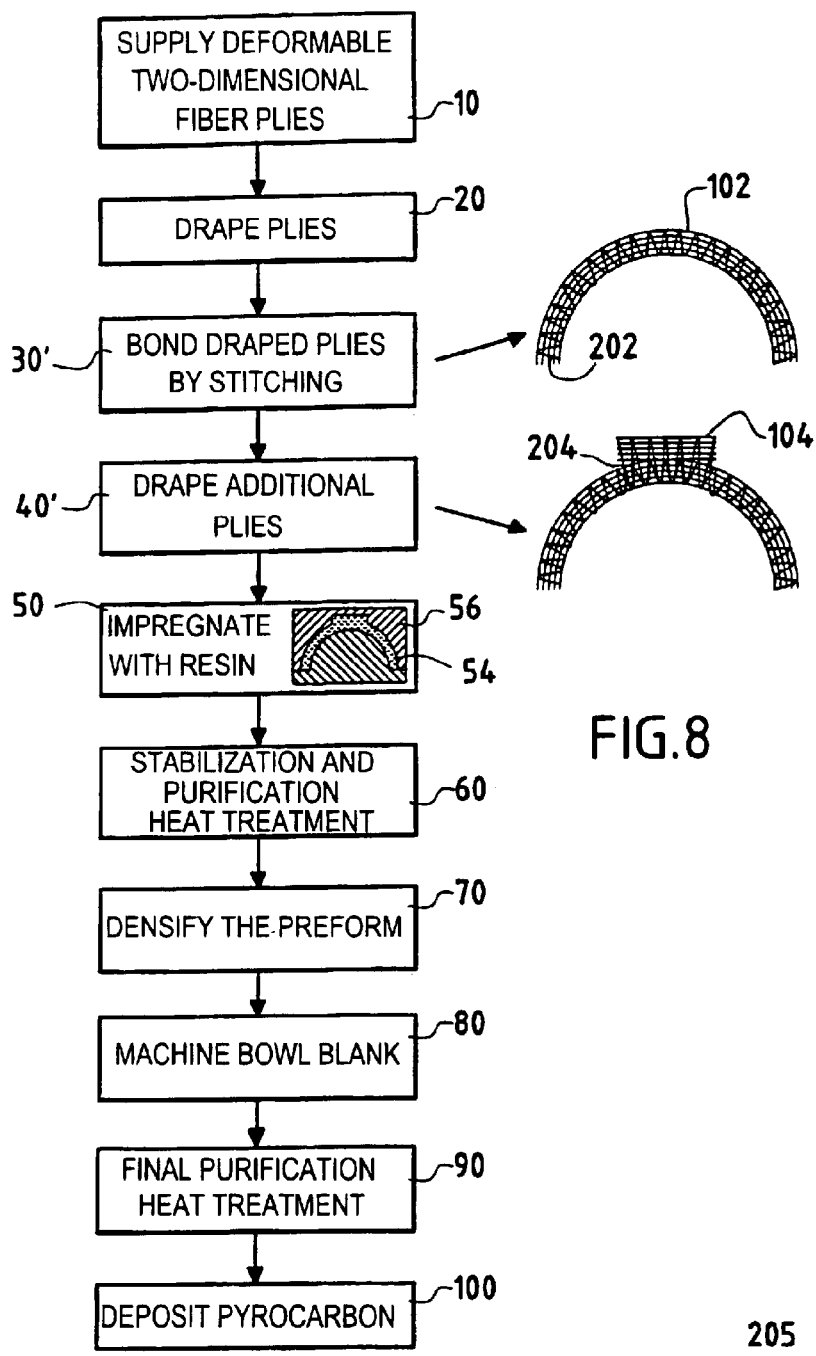
FIG. 8 is a flow chart showing the successive steps in a third implementation of a method in accordance with the invention.

In the method of FIG. 8, plies 102 are bonded to one another (step 30') by stitching using a thread 202 which passes through the set of draped plies 102. A similar thread 204 is used in the following step 40' to bond additional plies 104 to one another and to the plies 102, with the thread 204 passing through all of the plies 102 and 104.

The threads 202 and 204 can be carbon threads similar to those used for forming the plies 102 and 104. In a variant, it is possible to use threads of a sacrificial material, i.e. a material suitable for being eliminated by being dissolved or by heat at a subsequent stage in preparation of the bowl.

It is also possible to bond the plies 102 together by stitching and to bond the plies 104 together and to the plies 102 by needling, as in step 40 of FIG. 6.

It should also be observed that the method of bonding the plies 102 and 104 together by stitching could be used instead of the needling technique used in the method of FIG. 6.

In yet another implementation of the method of the invention, deformable two-dimensional plies are used that present a substantially central opening.

Figure 4:
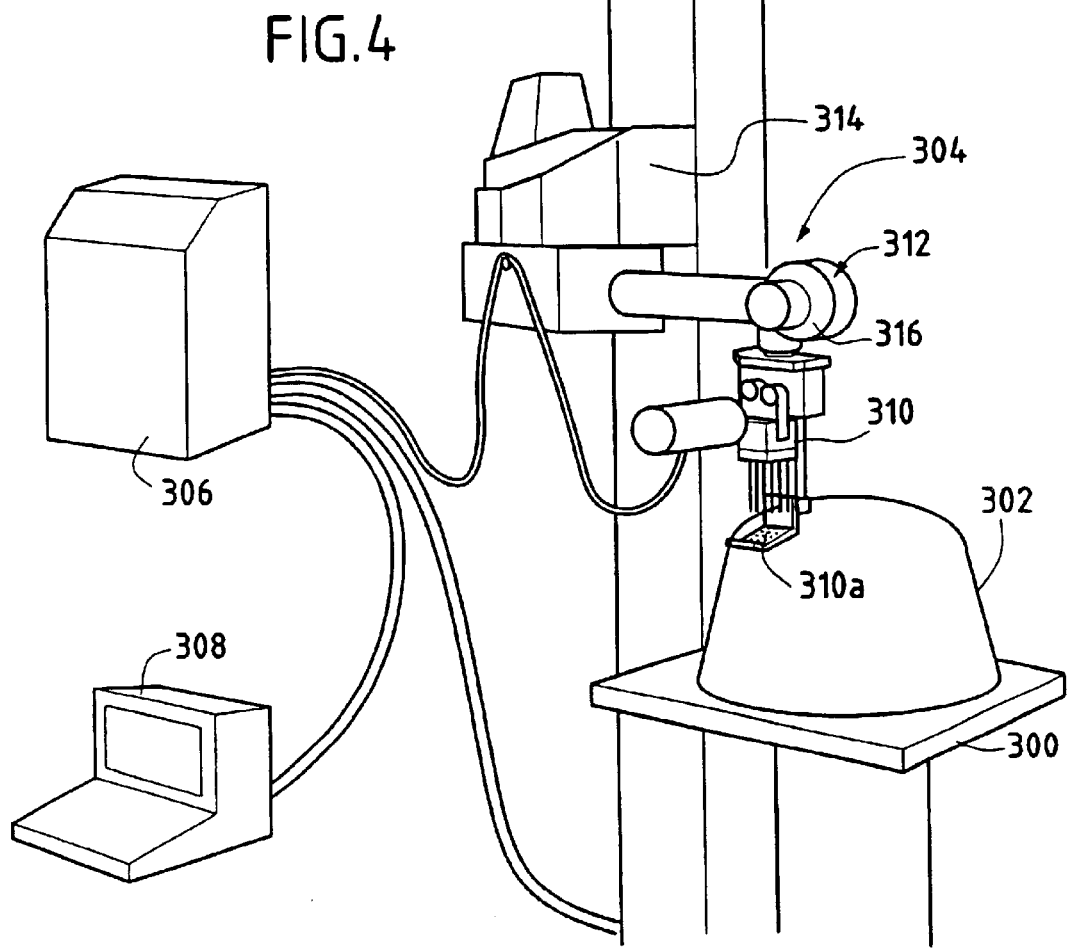
FIG. 4 is a highly diagrammatic view of needling apparatus in a form suitable for implementing the method of FIG. 2.
Figure 9:
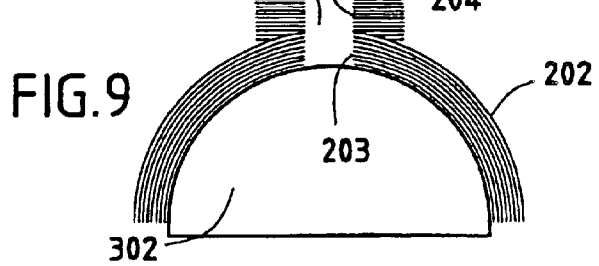
FIG. 9 is a highly diagrammatic view showing plies being draped in yet another implementation of a method in accordance with the invention.

As shown in FIG. 9, the plies 202 provided with a central opening 203 are draped on a former, e.g. the same former 302 as is shown in FIG. 4. The plies 202 are draped so that the openings 203 are in alignment in the central portion of the bottom of the preform that is being built up.

The plies 202 are bonded together by needling, as in the methods of FIGS. 2 and 6, or by stitching as in the method of FIG. 6.

Additional plies 204 are draped on the bottom of the preform, the plies 204 having substantially central openings 205 that are in alignment. The plies 204 are bonded to one another and to the plies 202 by needling or by stitching.

The aligned openings 203, 205 define a hole 152 passing through the bottom of the preform.

After the plies 202 and 204 have been draped and bonded together, manufacture of the bowl can continue with steps of consolidation by resin impregnation, stabilization and purification heat treatment, densification by chemical vapor infiltration, machining, preparing and installing a plug closing the hole 152, final densification by chemical vapor infiltration, purification heat treatment, and deposition of pyrolytic carbon, as in steps 50, 60, 70, 80, 82, 86, 88, 90, and 100 of the method of FIG. 6.

Other variants can be applied to the method described above without going beyond the ambit of the protection defined by the accompanying claims. Thus, the preform can be made out of yarns made of carbon precursor fibers instead of carbon fibers. Suitable carbon precursors include, in conventional manner, preoxidized polyacrylonitril (PAN), phenolic compounds, and pitch. The precursor is transformed into carbon by heat treatment after the preform has been built up.

The stage of consolidating the preform could be omitted. The preform with the superposed and bonded-together plies could then be placed in tooling of a shape corresponds to the shape of the bowl to be made so as to be inserted in an enclosure for densification by chemical vapor infiltration. The tooling can be withdrawn after a first densification stage that provides sufficient cohesion to enable densification to be continued without tooling.

The stage of heat treating the preform prior to densification could be omitted, in particular when the fibers do not need to be stabilized dimensionally. This can be the case when the carbon fibers of the preform have already been raised to a temperature not less than the temperature encountered subsequently. Purification can then be performed in a single operation after densification.

Alternatively, the final purification stage could be omitted, providing the degree of purity obtained for the preform by the heat treatment prior to densification, and when densification is performed with a carbon precursor under conditions that do not introduce significant quantities of impurities. When a high level of purity needs to be complied with for the material contained in the crucible supported by the manufactured bowl, as is the case for silicon that is for use in manufacturing semiconductors, the level of residual impurities in the bowl must preferably below 5 parts per million (ppm).

In addition, the preform could be densified using a matrix that is made at least in part out of a ceramic material, e.g. silicon carbide obtained by chemical vapor infiltration and using a gas precursor such as methyltrichlorosilane.

Finally, although the description above relates to forming a coating of pyrolytic carbon or of SiC particularly on the inside face of the bowl, other forms of protection could be adopted, instead of or as well as a coating of pyrolytic carbon or of SiC.

In particular, a protective layer could be interposed between the bowl and the crucible, to avoid attacking the composite material of the bowl, as can happen with a crucible made of silica and a bowl made of C/C composite material.

By way of example, the protective layer can itself be made of a thermostructural composite material, such as a C/C composite and it can behave as a "consumable" layer that needs to be replaced periodically. The C/C composite material used can be made up of two-dimensional plies of carbon fibers bonded together by a matrix of carbon obtained by using a liquid or chemical vapor infiltration.

Such a protective layer 6 fitting closely to the shape of the inside surface of the bowl 1 is shown in FIG. 1.

What is claimed is:

1. A method of manufacturing a bowl of thermostructural composite material formed by fiber reinforcement densified by a matrix, the method comprising making a preform constituting the fiber reinforcement by draping two-dimensional fiber plies on a former of a shape corresponding to the shape of the bowl to be made, and densifying the preform with a material constituting the matrix of the composite material, the method further comprising:

using deformable two-dimensional fiber plies, superposing said plies on the former, deforming the plies so that the plies fit closely on said former by deforming without forming folds, bonding the superposed plies to one another by means of fibers extending transversely relative to the plies so as to obtain a one-piece bowl preform which is subsequently densified, and wherein the deformable two dimensional fiber plies used are whole, being free from any cutouts or slots, thereby obtaining a preform for a complete bowl in one piece, and densification is performed on the complete bowl preform, and a hole is made through the bottom of the preform prior to densification of the preform by chemical vapor infiltration, and the hole is subsequently closed by a plug.

2. A method according to claim 1, characterized in that plies are used made of a fabric formed of a plurality of unidirectional sheets superposed in different directions and bonded together so as to form deformable individual mesh loops.

3. A method according to claim 2, characterized in that plies are used made of a fabric formed of two unidirectional sheets superposed with directions that are at an angle of 45° to 60° between each other.

4. A method according to claim 3, characterized in that:

the unidirectional sheets are bonded to one another by one of knitting a thread which passes from one side of the fabric to the other, by needling, or by stitching with a thread that passes from one side of the fabric to the other; and the plies are superposed by being mutually angularly offset around an axis passing through the bottom of the bowl.

5. A method according to claim 4, characterized in that:

the preform is consolidated prior to densification;

the preform is consolidated by being impregnated with a resin, by polymerizing the resin, and by carbonizing the polymerized resin;

prior to densification, the preform is subjected to heat treatment for dimensional stabilization and for purification at a temperature lying in the range 1600° C. to 2800° C.; and the preform is densified by chemical vapor infiltration.

6. A method according to claim 5, characterized in that the deformable two-dimensional fiber plies used are whole, having a substantially central opening, the plies are superposed on the former so that their openings are in alignment, thereby obtaining a bowl preform with a hole through the bottom of the preform constituted by the aligned openings in the plies, the preform is densified by chemical vapor infiltration;

a plug of thermostructural composite material is used;

an additional step of chemical vapor infiltration is performed after the plug has been put into place in the hole formed in the bottom of the preform;

after densification, purification heat treatment is performed at a temperature lying in the range 1600° C. to 2700° C.;

after densification, a coating of pyrolytic carbon or silicon carbide is formed on the bowl;

the inside face of the bowl is lined with a protective coating; and a protective coating is used made of a thermostructural composite material.

7. A method according to claim 4, characterized in that the superposed plies are bonded together by needling so as to either transfer fibers taken from the plies transversely thereto or with each newly draped ply needled onto the underlying structure; and the density of fibers transferred transversely relative to the plies is controlled throughout the thickness of the preform.

8. A method according to claim 3, characterized in that the unidirectional sheets are bonded to one another by knitting a thread which passes from one side of the fabric to the other.

9. A method according to claim 3, characterized in that the unidirectional sheets are bonded together by needling.

10. A method according to claim 3, characterized in that the unidirectional sheets are bonded together by stitching with a thread that passes from one side of the fabric to the other.

11. A method according to claim 2, characterized in that the unidirectional sheets are bonded to one another by knitting a thread which passes from one side of the fabric to the other.

12. A method according to claim 2, characterized in that the unidirectional sheets are bonded together by needling.

13. A method according to claim 2, characterized in that the unidirectional sheets are bonded together by stitching with a thread that passes from one side of the fabric to the other.

14. A method according to claim 2, characterized in that the plies are Superposed by being mutually angularly offset around an axis passing through the bottom of the bowl.

15. A method according to claim 1, characterized in that the inside face of the bowl is lined with a protective coating.

16. A method according to claim 15, characterized in that a protective coating is used made of a thermostructural composite material.

17. A method according to claim 1, characterized in that the preform is consolidated prior to densification.

18. A method according to claim 17, characterized in that the preform is consolidated by being impregnated with a resin, by polymerizing the resin, and by carbonizing the polymerized resin.

19. A method according to claim 1, characterized in that deformable fiber plies are used that are formed by knitting.

20. A method according to claim 1, characterized in that plies are used formed of carbon fiber yarns that are free of surface functions.

21. A method according to claim 1, characterized in that plies are used formed of carbon fiber yarns provided with an interphase coating of pyrolytic carbon.

22. A method according to claim 1, characterized in that the superposed plies are bonded together by needling so as to transfer fibers taken from the plies transversely thereto.

23. A method according to claim 22, characterized in that each newly draped ply is needled onto the underlying structure.

24. A method according to claim 23, characterized in that the density of fibers transferred transversely relative to the plies is controlled throughout the thickness of the preform.

25. A method according to claim 22, characterized in that the density of fibers transferred transversely relative to the plies is controlled throughout the thickness of the preform.

26. A method according to claim 1, characterized in that the superposed plies are bonded together by stitching.

27. A method according to claim 1, characterized in that the superposed plies are bonded together by implanting threads transversely relative to the plies.

28. A method according to claim 1, characterized in that, prior to densification, the preform is subjected to heat treatment for dimensional stabilization and for purification at a temperature lying in the range 1600° C. to 2800° C.

29. A method according to claim 1, characterized in that the preform is densified by chemical vapor infiltration.

30. A method according to claim 1, characterized in that a plug of thermostructural composite material is used.

31. A method according to claim 1, characterized in that an additional step of chemical vapor infiltration is performed after the plug has been put into place in the hole formed in the bottom of the preform.

32. A method according to claim 1, characterized in that after densification, purification heat treatment is performed at a temperature lying in the range 1600° C. to 2700° C.

33. A method according to claim 1, characterized in that after densification, a coating of pyrolytic carbon is formed on the bowl.

34. A method according to claim 1, characterized in that after densification, a coating of silicon carbide is formed on the bowl.

35. A method according to claim 1, wherein the shape of the bowl is suitable for receiving a crucible for drawing of ingots of metal.

36. A method of manufacturing a bowl of thermostructural composite material formed by fiber reinforcement densified by a matrix, the method comprising making a preform constituting the fiber reinforcement by draping two-dimensional fiber plies on a former of a shape corresponding to the shape of the bowl to be made, and densifying the preform with a material constituting the matrix of the composite material, the method further comprising:

using deformable two-dimensional fiber plies, superposing said plies on the former, deforming the plies so that the plies fit closely on said former by deforming without forming folds, and bonding the superposed plies to one another by means of fibers extending transversely relative to the plies so as to obtain a one-piece bowl preform which is subsequently densified, wherein the deformable two-dimensional fiber plies used are whole, having a substantially central opening, the plies are superposed on the former so that their openings are in alignment, thereby obtaining a bowl preform with a hole through the bottom of the preform constituted by the aligned openings in the plies, the preform is densified by chemical vapor infiltration, and the hole is subsequently closed by a plug.

37. A method according to claim 36, characterized in that the inside face of the bowl is lined with a protective coating.

38. A method according to claim 37, characterized in that a protective coating is used made of a thermostructural composite material.

39. A method according to claim 36, characterized in that a plug of thermostructural composite material is used.

40. A method according to claim 36, characterized in that plies are used formed of carbon fiber yarns that are free of surface functions.

41. A method according to claim 36, characterized in that plies are used formed of carbon fiber yarns provided with an interphase coating of pyrolytic carbon.

42. A method according to claim 36, characterized in that the density of fibers transferred transversely relative to the plies is controlled throughout the thickness of the preform.

43. A method according to claim 36, characterized in that the preform is consolidated prior to densification.

44. A method according to claim 43, characterized in that the preform is consolidated by being impregnated with a resin, by polymerizing the resin, and by carbonizing the polymerized resin.

45. A method according to claim 36, characterized in that, prior to densification, the preform is subjected to heat treatment for dimensional stabilization and for purification at a temperature lying in the range 1600° C. to 2800° C.

46. A method according to claim 36, characterized in that the preform is densified by chemical vapor infiltration.

47. A method according to claim 36, characterized in that an additional step of chemical vapor infiltration is performed after the plug has been put into place in the hole formed in the bottom of the preform.

48. A method according to claim 36, characterized in that after densification, purification heat treatment is performed at a temperature lying in the range 1600° C. to 2700° C.

49. A method according to claim 36, characterized in that after densification, a coating of pyrolytic carbon is formed on the bowl.

50. A method according to claim 36, characterized in that after densification, a coating of silicon carbide is formed on the bowl.

* * * * *